United States Patent [19]
Matsushita et al.

[11] Patent Number: 5,982,023
[45] Date of Patent: Nov. 9, 1999

[54] SEMICONDUCTOR DEVICE AND FIELD EFFECT TRANSISTOR

[75] Inventors: Shigeharu Matsushita, Katano; Emi Fujii, Nara-ken; Daijiro Inoue, Kyoto, all of Japan

[73] Assignee: Sanyo Electric Co., Ltd.

[21] Appl. No.: 08/951,160

[22] Filed: Oct. 15, 1997

[30] Foreign Application Priority Data

Oct. 16, 1996 [JP] Japan ................................ 8-273360

[51] Int. Cl.$^6$ ............... H01L 29/06; H01L 29/80; H01L 31/0328
[52] U.S. Cl. ............... 257/626; 257/284; 257/192; 257/623
[58] Field of Search ............... 257/626, 496, 257/631, 623, 640, 20, 24, 192–195, 218, 280, 284; 438/518

[56] References Cited

U.S. PATENT DOCUMENTS

| | | | |
|---|---|---|---|
| 4,047,196 | 9/1977 | White et al. | 357/55 |
| 4,545,109 | 10/1985 | Reichert | 257/623 |
| 4,742,379 | 5/1988 | Yamashita et al. | 257/195 |
| 5,258,645 | 11/1993 | Sato | 257/637 |
| 5,313,092 | 5/1994 | Tsuruta et al. | 257/620 |
| 5,712,504 | 1/1998 | Yano et al. | 257/452 |

OTHER PUBLICATIONS

A New Planar TMT Suitable For L–Band MMICs With RF Transmission And Reception Blocks Operating AT Vdd ≦ 2 V; by Minoru SAWADA, et al.; The Japan Society of Applied Physics.

New Planar Two–Mode Channel Field–Effect Transistor Suitable For L–Band Microwave Monolithic Integrated Circuits With RF Transmission And Reception Blocks Operating At Vdd ≦2 V; by Minoru SAWADA, et al.; Jpn. J. Appl. Phys. vol. 34 (1995) pp. 1168–1171.

Excellent Thermally–Stable Epitaxial Channel For Implanted Planar–Type Hetero–Junction Field–Effect Transistor; by Shigeharu Matsushita, et al.; The Japan Society of Applied Physics.

Excellent Thermally Stable Epitaxial Channel For Implanted Planar–Type Heterojunction Field–Effect Transistors; by Shigeharu Matsushita, et al.; The Japan Society of Applied Physics.

*Primary Examiner*—Tom Thomas
*Assistant Examiner*—Ori Nadav
*Attorney, Agent, or Firm*—Armstrong, Westerman, Hattori, McLeland, & Naughton

[57] ABSTRACT

A dummy gate is removed together with an $SiO_2$ film thereon by lift-off to form a reverse dummy-gate pattern with the $SiO_2$ film. A photoresist pattern is formed to cover the reverse dummy-gate pattern and an SiN protection film therebetween, and a mesa pattern is formed by mesa etching. The photoresist pattern is etched so that the edge of the photoresist pattern is located between the edge of the mesa pattern and the edge of the reverse dummy-gate pattern and the exposed part of the SiN protection film is etched. The edge of the SiN protection film is thus located inside the edge of the mesa pattern.

24 Claims, 10 Drawing Sheets

(DIRECTION A)  (DIRECTION B)

NO PATH FOR ENTRANCE OF WATER

FIG.8A-1
PRIOR ART
(DIRECTION A)

FIG.8A-2
PRIOR ART
(DIRECTION B)

FIG.8G-1
PRIOR ART
(DIRECTION A)

FIG.8G-2
PRIOR ART
(DIRECTION B)

PATH OF ENTRANCE OF WATER

SEMICONDUCTOR DEVICE AND FIELD EFFECT TRANSISTOR

BACKGROUND OF THE INVENTION

1. Field of the Invention

The present invention relates to a semiconductor device formed by mesa etching and a manufacturing method thereof.

2. Description of the Background Art

For field-effect transistors such as MESFETs (Metal Semiconductor Field-Effect Transistors) using compound semiconductors such as GaAs, various kinds of self-aligned processes are developed to reduce the effect of the surface depletion layer to reduce the source resistance. When manufacturing such a field-effect transistor, certain layers are formed on a GaAs substrate by MBE (Molecular-Beam Epitaxy), for example. Then a mesa etching process is applied to the epitaxial growth substrate for the purpose of device isolation.

Figure 7:
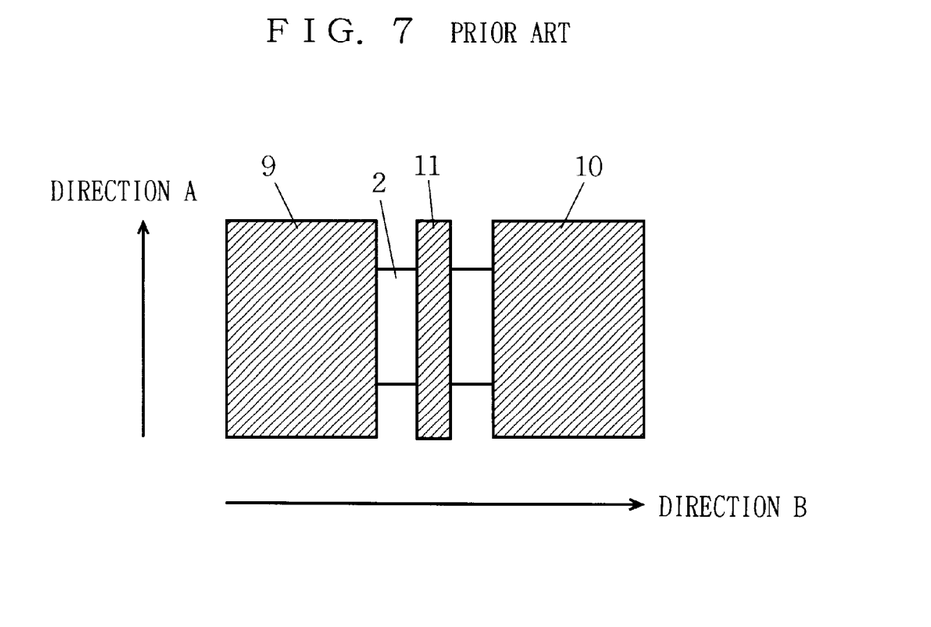
FIG. 7 is a schematic plan of an MESFET.

FIG. 7 is a plan roughly showing an MESFET and FIGS. 8A to 8G are process sections showing a conventional MESFET manufacturing method. FIG. 9A is a plan mainly showing the photoresist pattern in mesa etching, and FIG. 9B is a plan showing the mesa pattern after the mesa etching.

As shown in FIG. 7, a gate electrode 11 is formed on an n-type doped layer 2 and a source electrode 9 and a drain electrode 10 are disposed on either side of the gate electrode 11. In FIG. 7, the direction parallel to the elongate direction (the gate width direction) of the gate electrode 11 is represented as a direction A and the direction perpendicular to the elongate direction of the gate electrode 11 is represented as a direction B.

In FIGS. 8A–8G, process sections seen in the direction A are shown on the left side and process sections seen in the direction B are shown on the right side. In this manufacturing method, a self-aligned process utilizing a reverse dummy-gate pattern is conducted by using a GaAs epitaxial growth substrate.

Figure 8A:
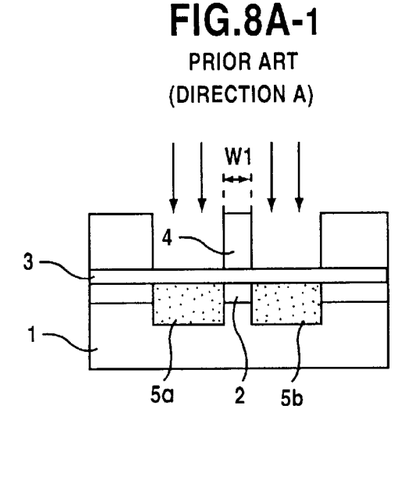
FIGS. 8A–8G are first to seventh process sections showing a conventional MESFET manufacturing method.
Figure 8A:
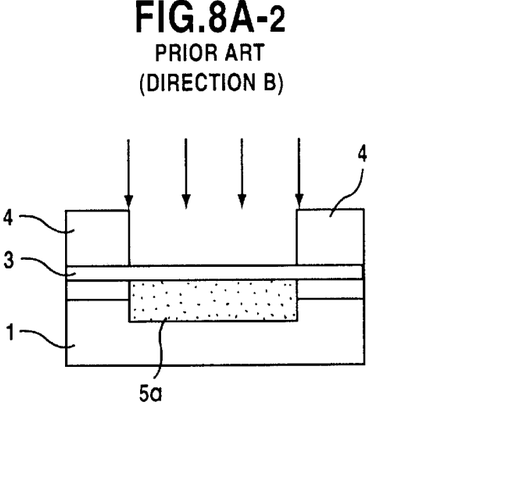
Figure 8B:
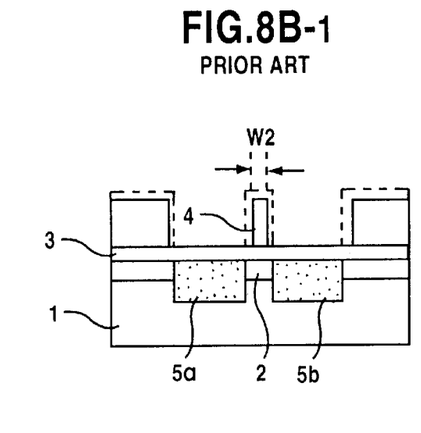
Figure 8B:
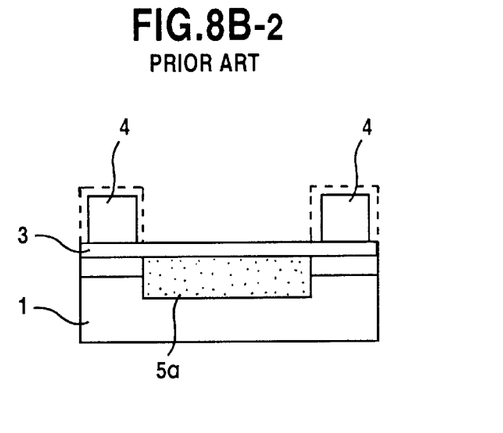
Figure 8C:
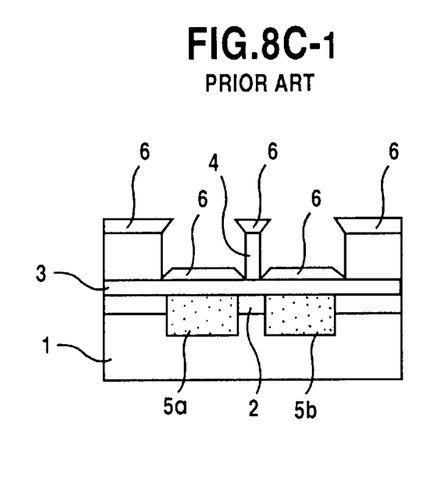
Figure 8C:
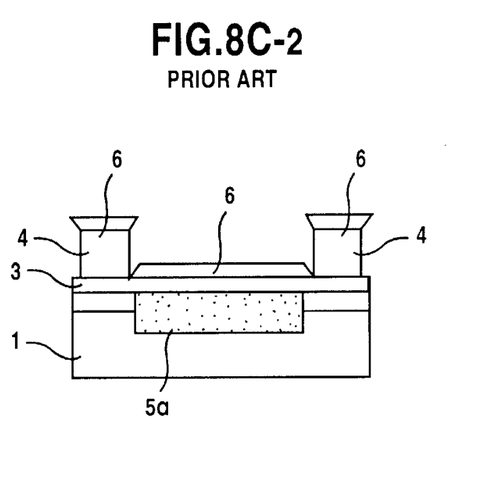
Figure 8D:
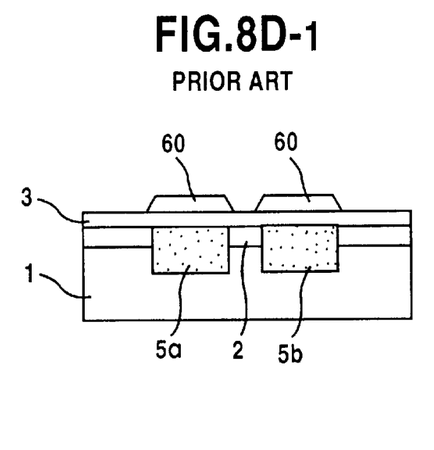
Figure 8D:
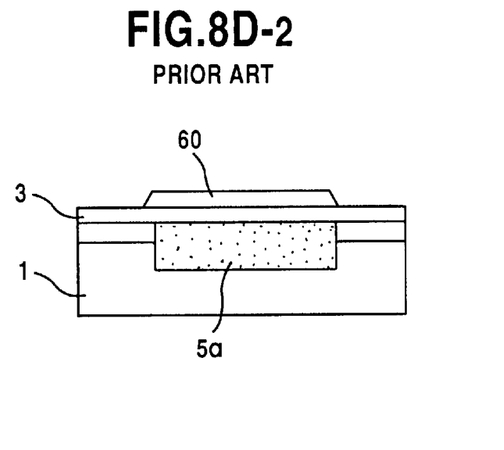
Figure 8E:
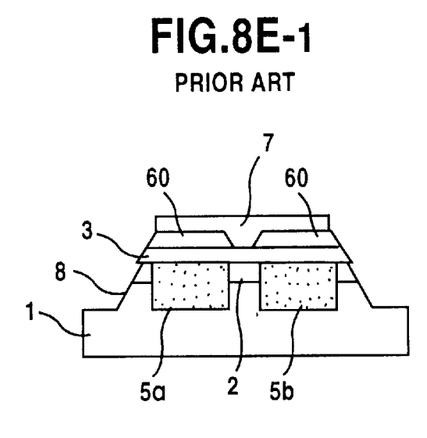
Figure 8E:
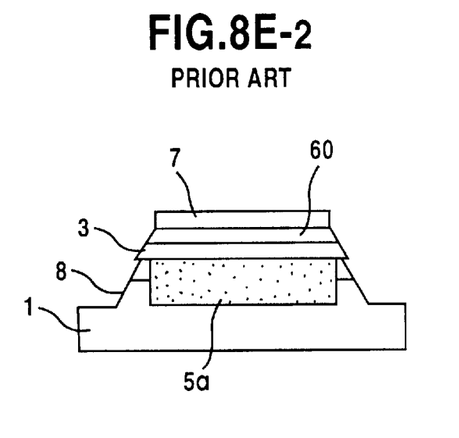
Figure 8F:
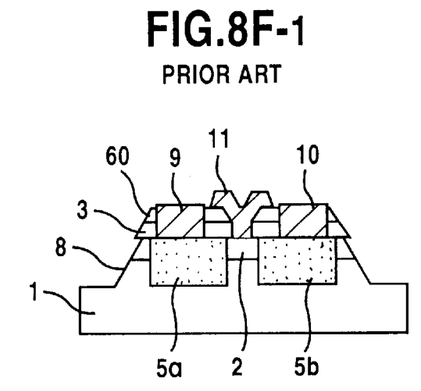
Figure 8F:
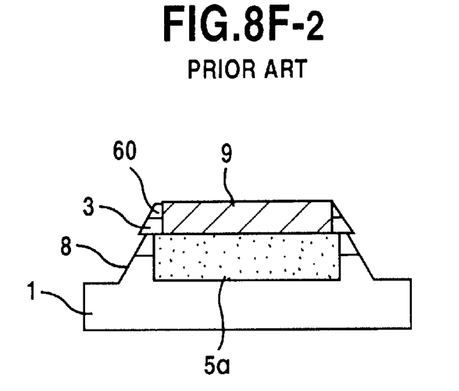
Figure 8G:
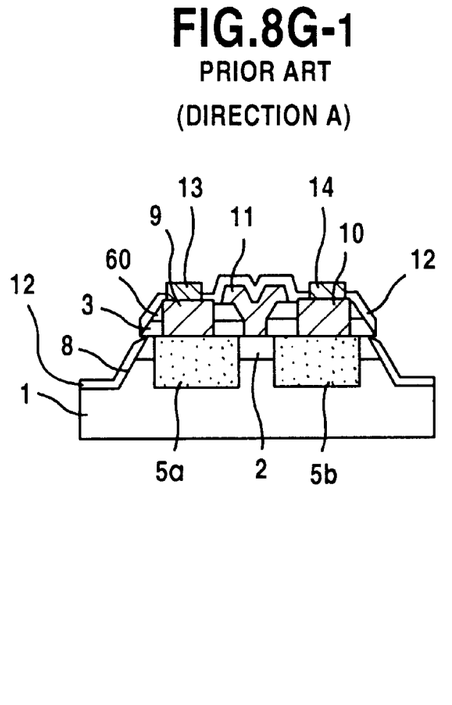
Figure 8G:
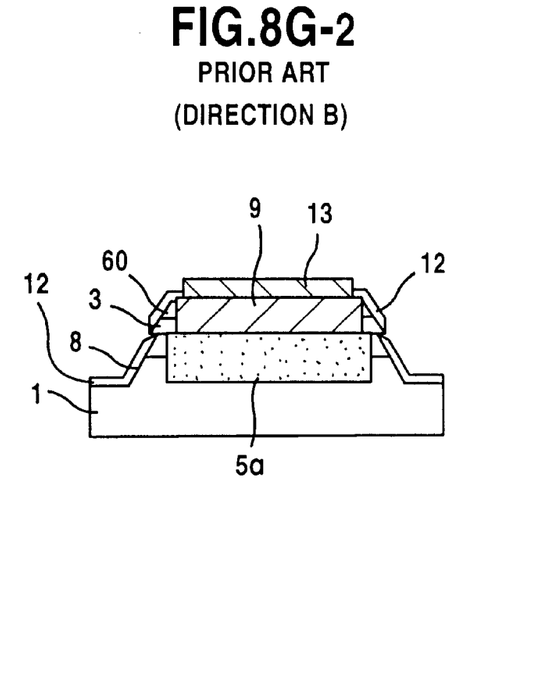
Figure 9A:
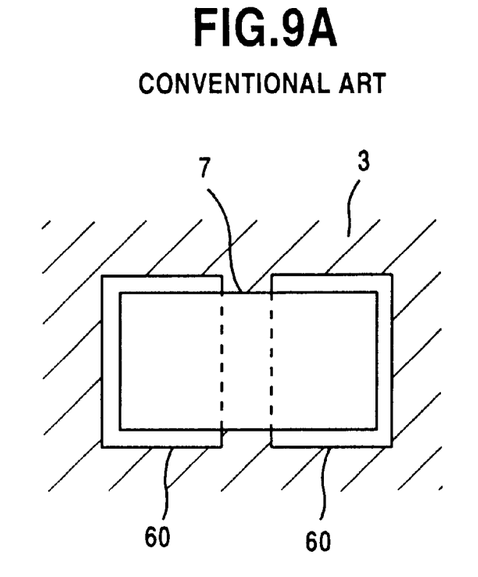
FIG. 9A is a plan mainly showing the photoresist pattern in mesa etching.
Figure 9B:
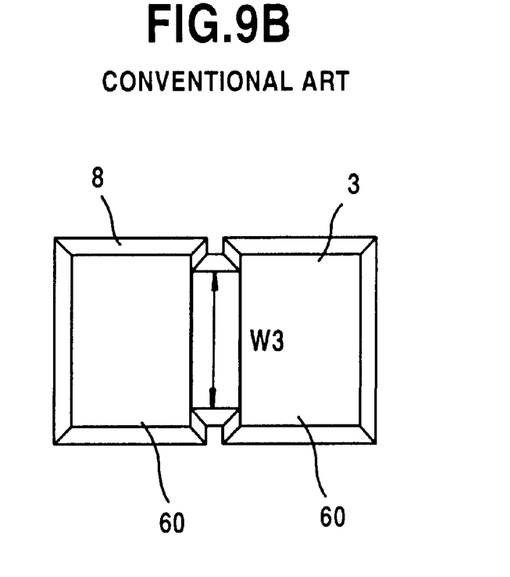
FIG. 9B is a plan showing the mesa pattern after mesa etching.

As shown in FIG. 8A, an n-type doped layer 2 is formed in the surface of a semi-insulating GaAs substrate 1. A 50-nm-thick SiN protection film 3 is formed by ECR-plasma-CVD (Electron Cyclotron Resonance Plasma Chemical Vapor Deposition) on the n-type doped layer 2, and a dummy gate 4 is formed on the SiN protection film 3 with photoresist. Then $n^+$-type doped layers (high-concentration doped regions) 5a, 5b for obtaining ohmic contact are formed in the surface of the GaAs substrate 1 by a self-aligned ion implantation by using the dummy gate 4 as a mask.

Next, as shown in FIG. 8B, the dummy gate 4 is etched by oxygen plasma to reduce the dummy gate length. Thus the dummy gate length is reduced from W1 to W2.

Next, as shown in FIG. 8C, an $SiO_2$ film 6 is formed all over the SiN protection film 3 and the dummy gate 4 by ECR-plasma-CVD. Subsequently, the $SiO_2$ film 6 is selectively etched only in the part attached on the sidewall of the dummy gate 4 with buffered hydrofluoric acid composed of a mixed solution containing HF and $NH_4F$ in a ratio of 1:100.

Further, as shown in FIG. 8D, the dummy gate 4 is removed together with the $SiO_2$ film 6 thereon by lift-off to reverse the pattern of the dummy gate 4. A reverse dummy-gate pattern 60 composed of the $SiO_2$ film 6 is thus formed. Then, to activate the $n^+$-type doped layers 5a, 5b, annealing is applied for a short time with a halogen lamp.

Next, as shown in FIG. 8E, a photoresist pattern 7 is formed on the reverse dummy-gate pattern 60 and the SiN protection film 3 therebetween (refer to FIG. 9A), and the exposed part of the SiN protection film 3 is etched by using the reverse dummy-gate pattern 60 and the photoresist pattern 7 as masks. Then mesa etching is applied for device isolation with a mixed solution of tartaric acid and hydrogen peroxide. The mesa pattern 8 is thus formed (refer to FIG. 9B).

Next, as shown in FIG. 8F, the photoresist pattern 7 for mesa etching is removed and then a source electrode 9 and a drain electrode 10 of AuGe/Ni/Au are formed respectively on the $n^+$-type doped layers 5a, 5b by using patterning technology, and a gate electrode 11 of Ti/Pd/Au is formed on the n-type doped layer 2.

Finally, as shown in FIG. 8G, a protection film 12 for moisture resistance is formed all over the surface and contact holes are formed in the protection film 12 above the source electrode 9 and the drain electrode 10, and then electrodes 13, 14 for connection with an external bias power-supply are formed by patterning technology.

As shown in FIG. 9B, the length W3 of the side of the mesa pattern 8 in the gate width direction (the direction A) corresponds to the gate width of the MESFET. The length in the gate width direction of the $n^+$-type doped layers 5a, 5b located under the reverse dummy-gate pattern 60 is equal to or longer than the gate width.

In the above-described conventional MESFET manufacturing method, in the mesa etching step shown in FIG. 8E, the SiN protection film 3 forms a protrusion like an awning over the periphery of the mesa pattern 8.

Figure 10A:
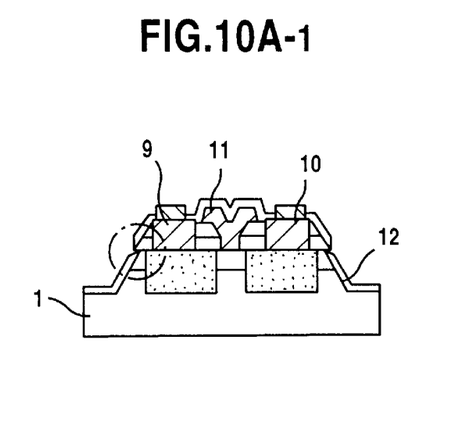
FIGS. 10A, 10B are diagrams for illustrating a problem in the conventional MESFET manufacturing method.
Figure 10A:
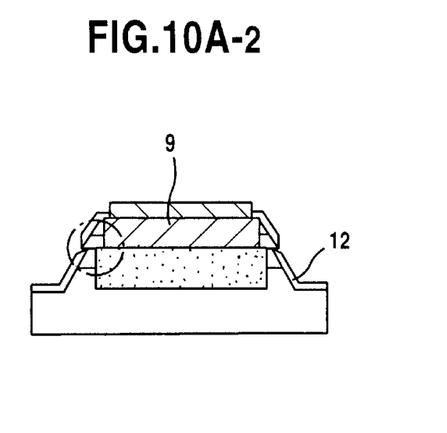
Figure 10A:
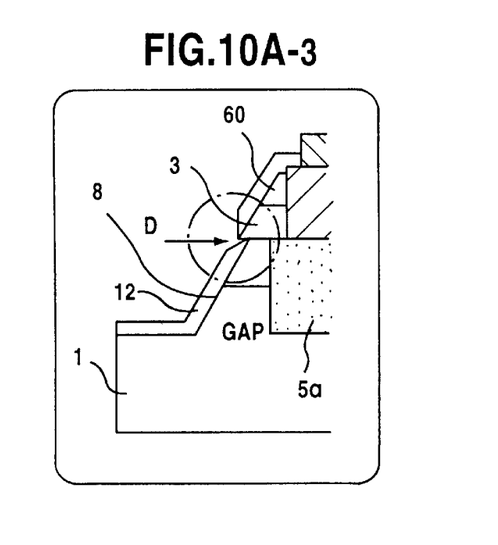
Figure 10B:
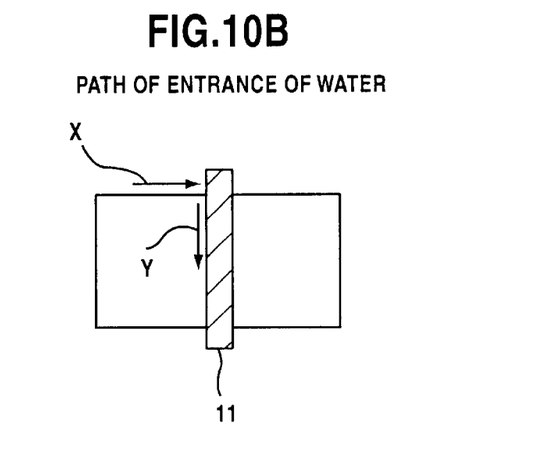

When the protection film 12 is formed for moisture resistance in the process step shown in FIG. 8G, this protrusion forms a small gap D in the protection film 12 on the stepped part between the mesa pattern 8 and the SiN protection film 3 (the mesa-step portion), as shown in FIG. 10A. Moisture resistance tests show that water penetrates through the gap D to the contact between the gate electrode 11 and the GaAs substrate 1, as shown by the arrows X, Y in FIG. 10B, to deteriorate characteristics of the MESFET.

SUMMARY OF THE INVENTION

An object of the present invention is to provide a semiconductor device which prevents entrance of water at the edge of a mesa pattern to improve the moisture resistance and a manufacturing method thereof.

A semiconductor device of the present invention includes: a semiconductor substrate having a certain layer and a mesa-shaped region including a gate region; and a protection film formed on the mesa-shaped region except in the gate region; wherein an edge of the protection film in at least the gate width direction is located in the same position as or on the inside of an edge of the mesa-shaped region.

Since the edge of the protection film formed on the mesa-shaped region does not outwardly protrude beyond the edge of the mesa-shaped region in at least the gate width direction, the protection film does not form a protrusion like an awning over the edge of the mesa-shaped region. Therefore no path for entrance of water is formed along the edge of the mesa-shaped region in the gate length direction, allowing no water to penetrate into the contact between the gate electrode and the semiconductor substrate. This improves the moisture resistance of the semiconductor device.

The semiconductor device may further include an insulating film formed in a region on the protection film except in the gate region, with an edge of the insulating film in at least the gate width direction located in the same position as or on the inside of the edge of the mesa-shaped region.

In this case, when a protection film for moisture resistance is formed to cover the mesa-shaped region of the semiconductor substrate, the protection film and the insulating film, no gap is formed in the moisture resisting protection film on the stepped part between the mesa-shaped region and the protection film. Therefore no path for water penetration is formed along the periphery of the mesa-shaped region.

The insulating film may have a reverse pattern of a dummy gate formed on the protection film in manufacturing. This improves the moisture resistance of the semiconductor device manufactured by a self-aligned process utilizing a reverse dummy-gate pattern.

The semiconductor device may further include a high-concentration doped region provided in the semiconductor substrate under the insulating film, wherein a length of the high-concentration doped region in the gate width direction may be shorter than a width of the gate region of the mesa-shaped region.

Preferably, the distance between the edge of the mesa-shaped region and the edge of the insulating film in the gate width direction is equal to or shorter than 5% of a unit gate width. Also preferably, the distance between the edge of the mesa-shaped region and the edge of the insulating film in the gate width direction is 5 µm or shorter. Then the reduction in characteristics is suppressed.

The semiconductor substrate may be formed of gallium arsenide, and the protection film may be formed of silicon nitride. The insulating film may be formed of silicon oxide.

The semiconductor device may further include a gate electrode formed on the gate region of the mesa-shaped region. The certain layer and the high-concentration doped region may have one conductivity type.

A semiconductor device manufacturing method according to another aspect of the present invention includes the steps of: forming a protection film on a semiconductor substrate including a certain layer; etching the semiconductor substrate around a device region including a gate region together with the protection film to form a mesa-shaped region; and etching the protection film so that an edge of the protection film in at least the gate width direction does not protrude outside an edge of the mesa-shaped region.

Then, in at least the gate width direction, the protection film does not form a protrusion like an awning over the edge of the mesa-shaped region. Therefore no path for entrance of water is formed along the edge of the mesa-shaped region in the gate length direction and penetration of water into the contact between the gate electrode and the semiconductor substrate is prevented. This improves the moisture resistance of the semiconductor device.

Particularly, the semiconductor device manufacturing method may further include the steps of forming a mask pattern for formation of a gate electrode on the protection film, and forming a resist pattern for mesa etching on the mask pattern and on the device region including the gate region, wherein the step of forming the mesa-shaped region may include the step of mesa-etching the semiconductor substrate together with the protection film using the resist pattern as a mask to form the mesa-shaped region, and the step of etching the protection film may include the steps of etching the resist pattern so that an edge of the resist pattern in at least the gate width direction is located between the edge of the mesa-shaped region and an edge of the mask pattern, and etching the protection film by using the etched resist pattern as a mask.

In this case, the mesa etching to the semiconductor substrate and the etching to the protection film can be done by using a common resist pattern.

Particularly, the mask pattern may have a reverse pattern of a dummy gate formed on the protection film. In this case, the moisture resistance of the semiconductor device manufactured by a self-aligned process utilizing a reverse dummy-gate pattern is improved.

The step of forming the mask pattern may include the steps of forming a dummy gate on the gate region on the protection film, forming a mask material on the dummy gate and the protection film, and removing the dummy gate together with the mask material on the dummy gate by a lift-off.

The step of forming the dummy gate may include the steps of forming a photoresist on a region including the gate region on the semiconductor substrate, the photoresist having a length longer than the length of the gate region in the gate length direction, forming a high-concentration doped region in the semiconductor substrate by an ion implantation using the photoresist as a mask, and etching the photoresist so that the length of the photoresist in the gate length direction is equal to the length of the gate region to form the dummy gate.

The semiconductor device manufacturing method may further include the steps of removing the resist pattern after etching the protection film, removing, by etching, the protection film above the gate region and above the high-concentration doped region after removing the resist pattern, forming an ohmic electrode on the high-concentration doped region, and forming a gate electrode on the gate region.

The mask pattern may be formed of an insulating film. It is preferred that the distance between the edge of the mesa-shaped region and the edge of the mask pattern in the gate width direction is equal to or shorter than 5% of a unit gate width. It is also preferred that the distance between the edge of the mesa-shaped region and the edge of the mask pattern in the gate width direction is 5 µm or shorter. Then the deterioration in characteristics can be suppressed.

The semiconductor substrate may be formed of gallium arsenide and the protection film may be formed of silicon nitride. The mask pattern may be formed of silicon oxide. The certain layer and the high-concentration doped region may have one conductivity type.

These and other objects, features, aspects and advantages of the present invention will become more apparent from the following detailed description of the present invention when taken in conjunction with the accompanying drawings.

DESCRIPTION OF THE PREFERRED EMBODIMENT

FIGS. 1A–1H are process sections showing a semiconductor device manufacturing method according to an embodiment of the present invention. FIG. 2A is a plan mainly showing the photoresist pattern in mesa etching and FIG. 2B is a plan showing the mesa pattern after the mesa etching. In this embodiment, a GaAs-MESFET is described as an example of a semiconductor device.

As shown in FIG. 7, the direction parallel to the elongate direction (the gate width direction) of the gate electrode 11 is represented as the direction A and the direction vertical to the elongate direction of the gate electrode 11 is represented as the direction B, and FIGS. 1A–1H show process sections seen in the direction A on the left side and process sections seen in the direction B on the right side. The manufacturing method of this embodiment uses a self-aligned process utilizing a reverse dummy-gate pattern.

Figure 1A:
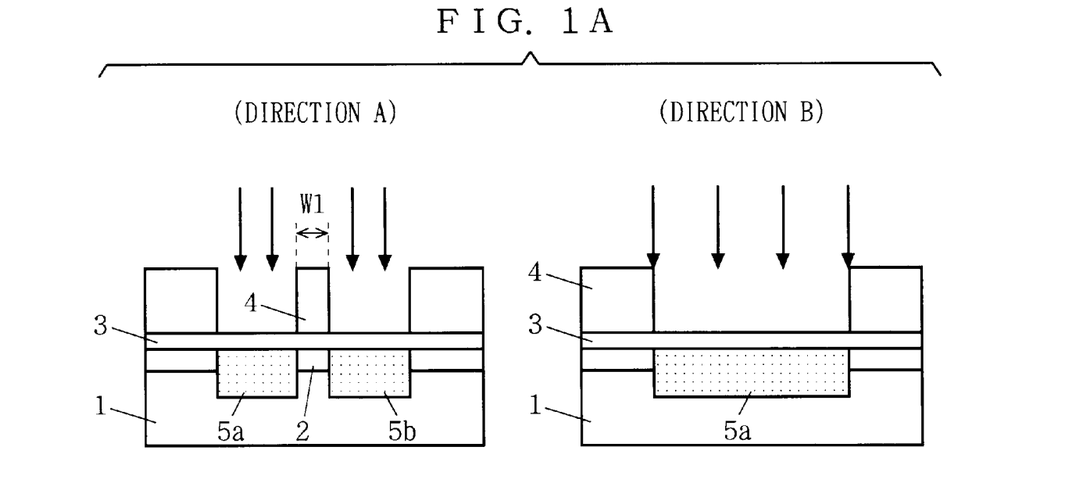
FIGS. 1A–1H are first to eighth process sections showing a semiconductor device manufacturing method according to an embodiment of the present invention.
Figure 2A:
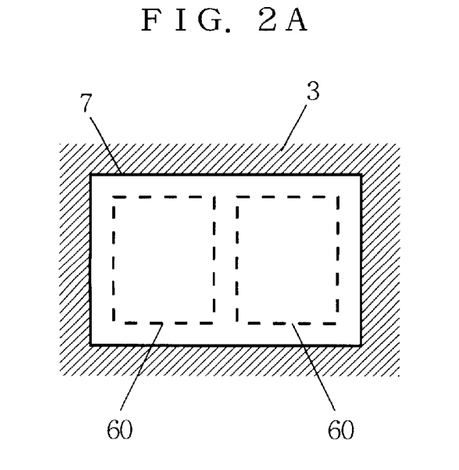
FIG. 2A is a plan showing the photoresist pattern in mesa etching.
Figure 2B:
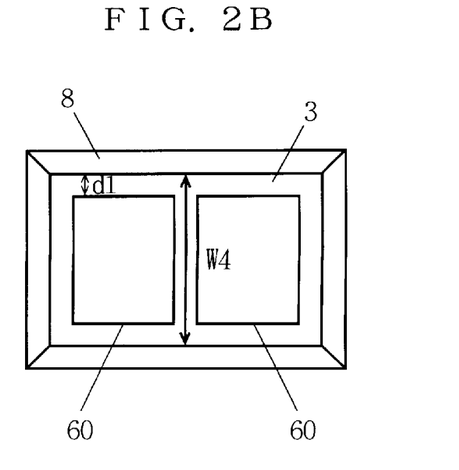
FIG. 2B is a plan showing the mesa pattern after mesa etching.

As shown in FIG. 1A, an n-type doped layer 2 is formed in the surface of a semi-insulating GaAs substrate 1. A 50-nm-thick SiN protection film 3 is formed by ECR-plasma-CVD on the n-type doped layer 2 and a dummy gate 4 is formed on the SiN protection film 3 with photoresist. The SiN protection film 3 is provided to prevent contamination of the surface of the n-type doped layer 2 by the photoresist. Then, by using the dummy gate 4 as a mask, $n^+$-type doped layers (high-concentration doped regions) 5a, 5b for obtaining ohmic contact are formed in the surface of the GaAs substrate 1 by a self-aligned ion implantation.

Figure 1B:
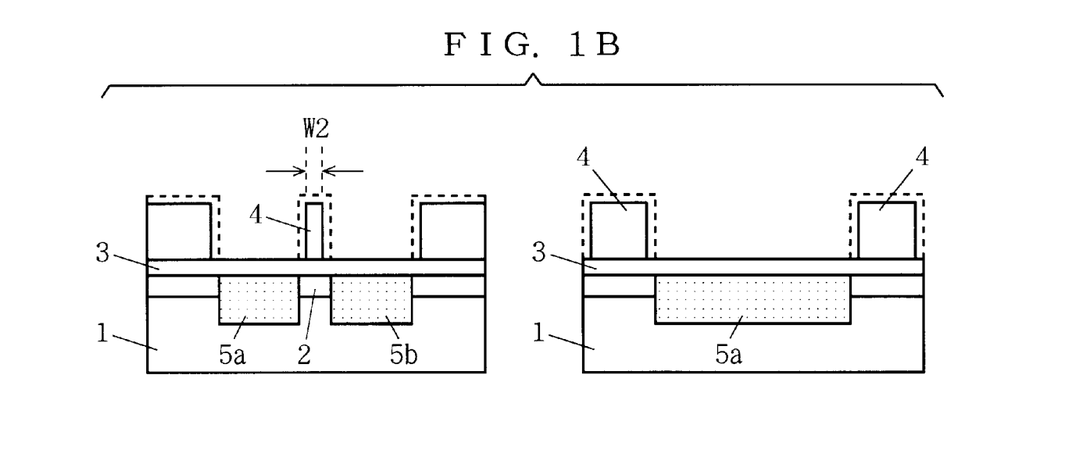

Next, as shown in FIG. 1B, the dummy gate 4 is etched by oxygen plasma to reduce the dummy gate length. Thus the dummy gate length is reduced from W1 to W2. As will be seen from the following process steps, this process step defines the distances between the ends of the gate electrode and the inner ends of the $n^+$-type doped layers 5a, 5b. This distance is generally 200 to 500 nm with GaAs-MESFETs.

Figure 1C:
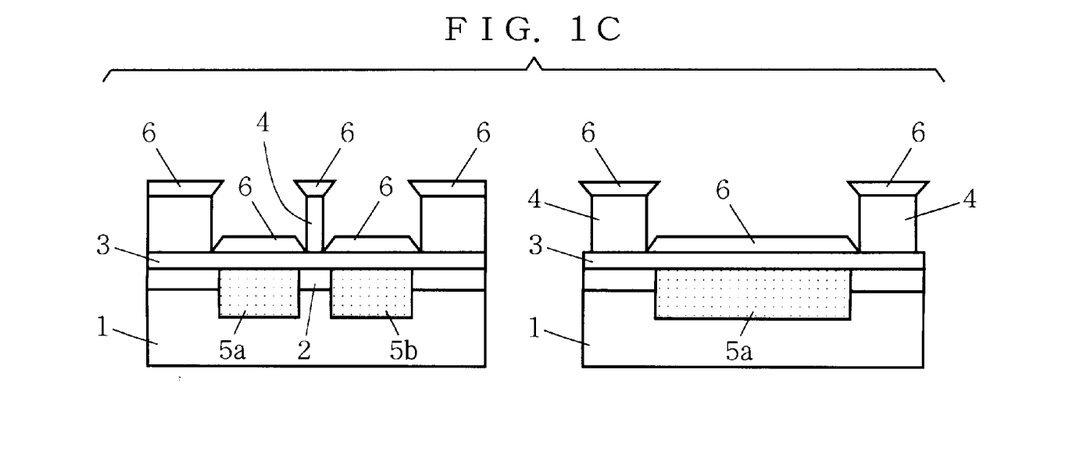

Next, as shown in FIG. 1C, an $SiO_2$ film 6 is formed all over the SiN protection film 3 and the dummy gate 4 by ECR-plasma-CVD. Subsequently, the $SiO_2$ film 6 is selectively etched only in the part attached on the sidewall of the dummy gate 4 with a buffered hydrofluoric acid composed of a mixed solution of HF and $NH_4F$ in a ratio of 1:100.

Figure 1D:
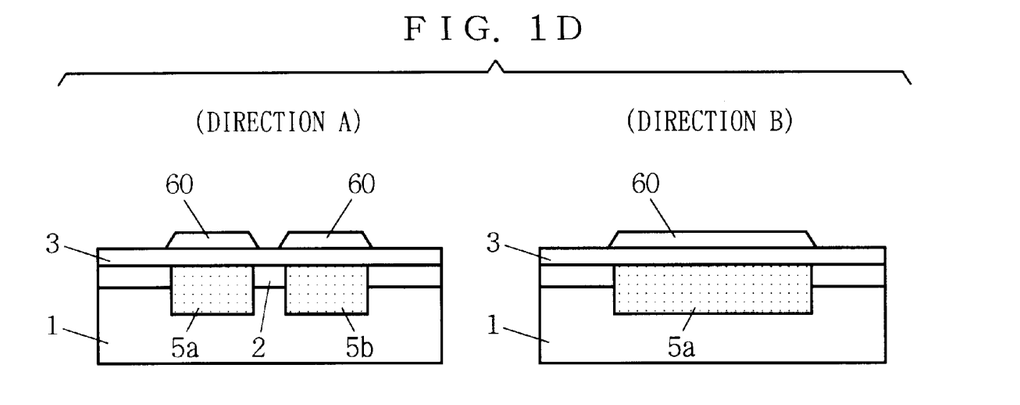

Further, as shown in FIG. 1D, the dummy gate 4 is removed together with the $SiO_2$ film 6 thereon by a lift-off process to reverse the pattern of the dummy gate 4. A reverse dummy-gate pattern 60 composed of the $SiO_2$ film 6 is thus formed. Then, to activate the $n^+$-type doped layers 5a, 5b, annealing is applied for a short time with a halogen lamp.

Figure 1E:
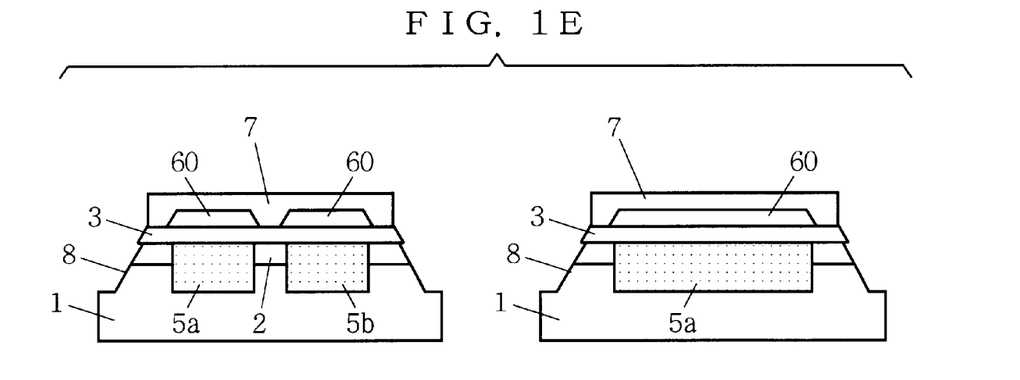

Next, as shown in FIG. 1E, a photoresist pattern 7 is formed to cover the reverse dummy-gate pattern 60 and the SiN protection film 3 therebetween (refer to FIG. 2A), and the exposed part of the SiN protection film 3 is etched by using the reverse dummy-gate pattern 60 and the photoresist pattern 7 as masks, and then mesa etching is applied for device isolation with a mixed solution of tartaric acid and hydrogen peroxide. The mesa pattern 8 is thus formed.

Figure 1F:
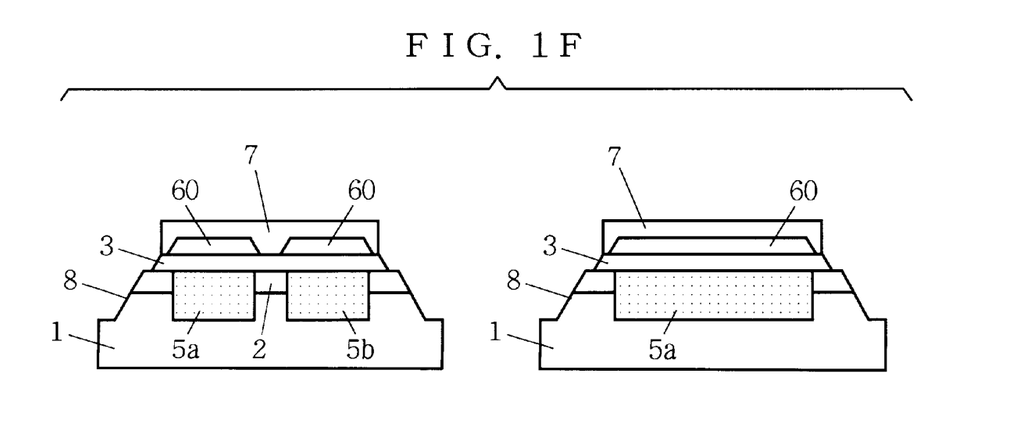
Figure 1G:
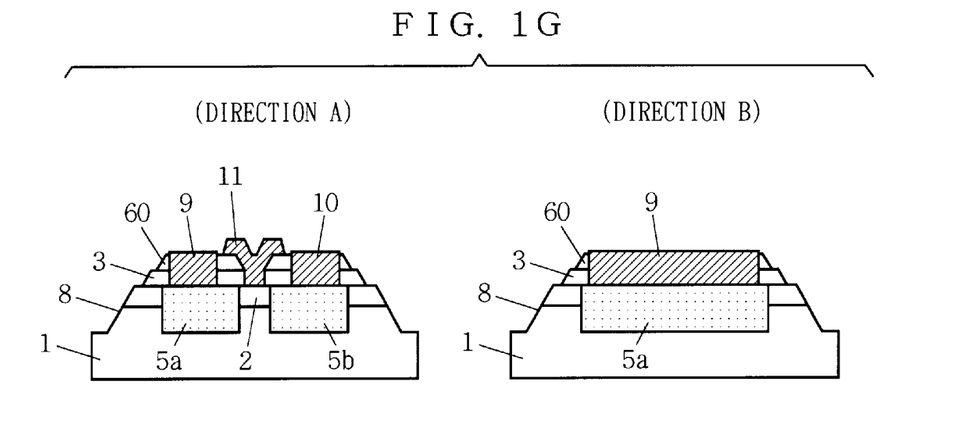

Next, as shown in FIG. 1F, the photoresist pattern 7 is etched by oxygen plasma so that the edge of the photoresist pattern 7 is located between the edge of the mesa pattern 8 and the edge of the reverse dummy-gate pattern 60, and then the exposed part of the SiN protection film 3 is etched by using plasma of a mixed gas of $CF_4$ and $O_2$. Next, as shown in FIG. 1G, the photoresist pattern 7 for mesa etching is removed and then a source electrode 9 and a drain electrode 10 of AuGe/Ni/Au are formed respectively on the $n^+$-type doped layers 5a, 5b by using patterning technology and a gate electrode 11 of Ti/Pd/Au is formed on the n-type doped layer 2.

Figure 1H:
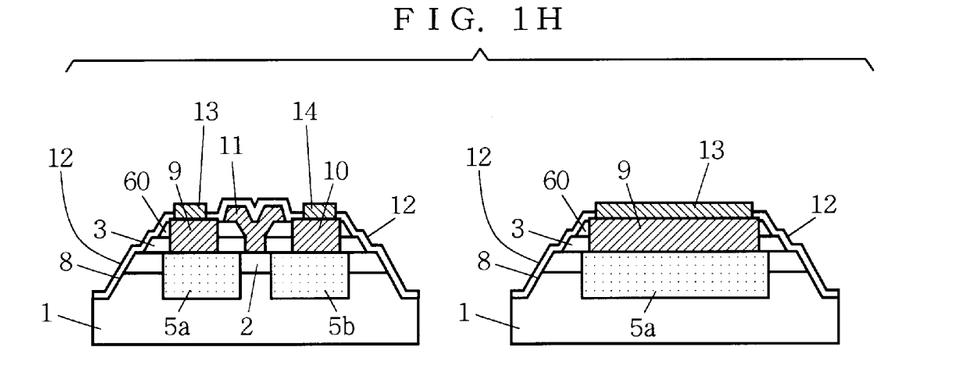

Finally, as shown in FIG. 1H, a protection film 12 for moisture resistance is formed all over the surface and contact holes are formed in the protection film 12 above the source electrode 9 and the drain electrode 10, and then electrodes 13, 14 for connection with an external bias power-supply are formed by patterning technology.

As shown in FIG. 2B, the length W4 of the side of the mesa pattern 8 in the gate width direction (the direction A) is longer than the width in the gate width direction of the $n^+$-type doped layers 5a, 5b located under the reverse dummy-gate pattern 60.

To suppress the reduction in characteristics, it is preferable that the distance d1, in the gate width direction, between the edge of the mesa pattern 8 and the edge of the reverse dummy-gate pattern 60 is 5% of the unit gate width or shorter, and generally, it is preferable that it is 5 $\mu$m or shorter. In this case, the reduction in drain saturation current Idss can be suppressed to 10% or lower.

Figure 3A:
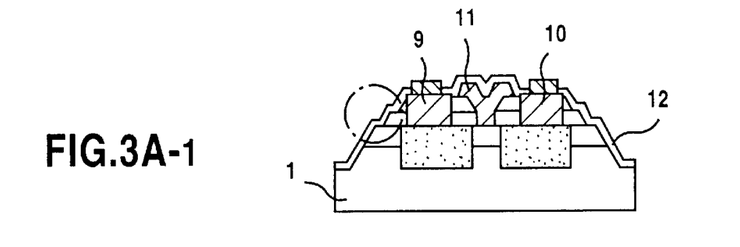
FIGS. 3A, 3B are diagrams for describing the moisture resistance of the semiconductor device manufactured by the method shown in FIGS. 1A–1H.
Figure 3A:
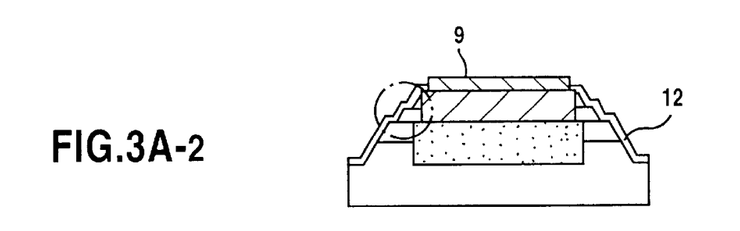
Figure 3A:
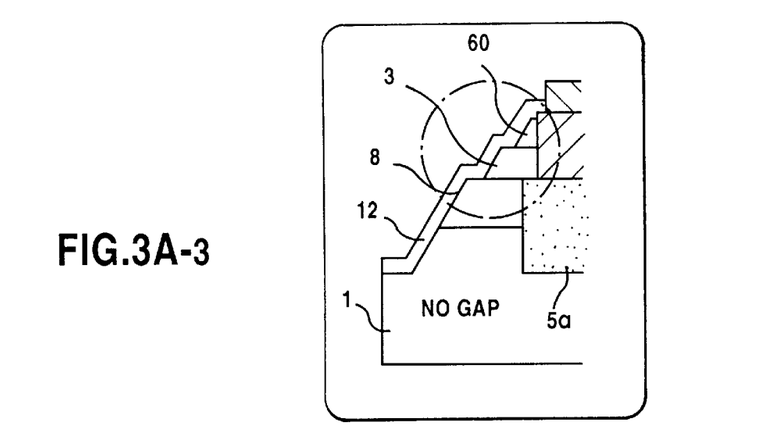
Figure 3B:
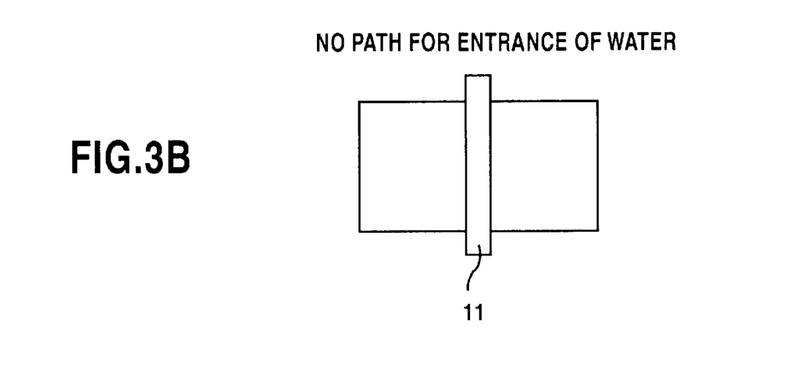

This manufacturing method locates the edge of the SiN protection film 3 inside the edge of the mesa pattern 8. Therefore, as shown in FIG. 3A, the SiN protection film 3 does not project over the edge of the mesa pattern 8. Then no gap is formed in the protection film 12 above the stepped part (the mesa step portion) between the mesa pattern 8 and the SiN protection film 3. Hence, as shown in FIG. 3B, no path for entrance of water is formed in the gate length direction (the direction B) of the mesa pattern 8. This prevents penetration of water into the contact between the gate electrode 11 and the GaAs substrate 1, thus providing a semiconductor device with improved reliability.

The edge of the SiN protection film 3 may be located in the same position as the edge of the mesa pattern 8. Also in this case, no protrusion is formed with the SiN protection film 3 above the edge of the mesa pattern 8, and therefore no gap is formed in the protection film 12 on the stepped part (the mesa step portion) between the mesa pattern 8 and the SiN protection film 3, allowing no water to penetrate to the contact between the gate electrode 11 and the GaAs substrate 1.

Figure 4:
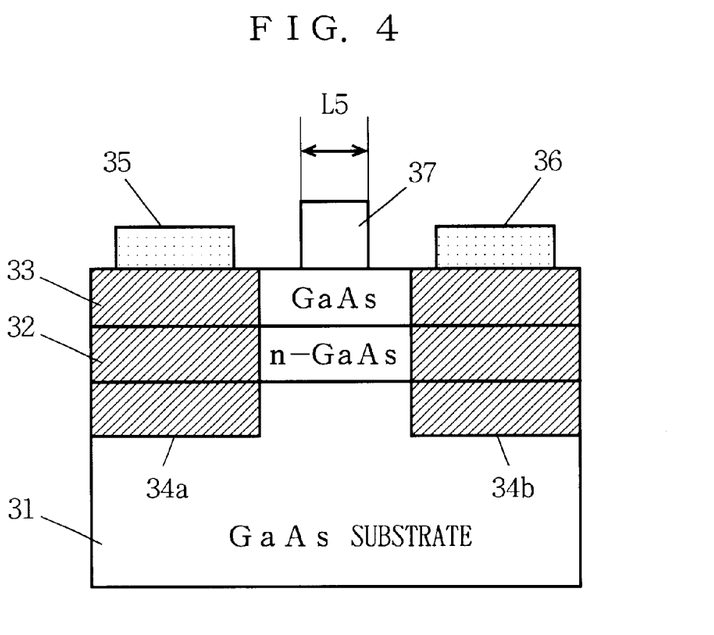
FIG. 4 is a schematic cross-section showing the structure of FETs of the embodiment and a comparison example used in a high-temperature humidifying test.

We fabricated an MESFET having the structure shown in FIG. 4 by the above-described fabrication method of the embodiment and conducted a high-temperature humidifying test. For comparison, we also fabricated an MESFET having a protrusion at the mesa step portion by using the conventional manufacturing method and conducted a high-temperature humidifying test. The example for comparison has the structure shown in FIG. 4, too. FIG. 4 only shows the unit gate of the MESFET.

In FIG. 4, a 20-nm-thick n-type GaAs layer 32 is formed on a semi-insulating GaAs substrate 31, and a 20-nm-thick undoped GaAs layer 33 is formed on the n-type GaAs layer 32. The n-type GaAs layer 32 is doped with Si to a concentration of $2 \times 10^{18}$ cm$^{-3}$. In the undoped GaAs layer 33, the n-type GaAs layer 32, and the GaAs substrate 31, n$^+$ layers 34a, 34b are formed at a certain interval by an Si ion implantation with a peak carrier concentration of $2 \times 10^{18}$ cm$^{-3}$.

A source electrode 35 and a drain electrode 36 are formed respectively on the n$^+$ layers 34a, 34b. A gate electrode 37 is formed on the undoped GaAs layer 33 between the n$^+$ layers 34a, 34b. The gate length L5 of this MESFET is 0.5 μm, and the gate width is 400 μm (the unit gate width 100 μm×4).

Figure 5:
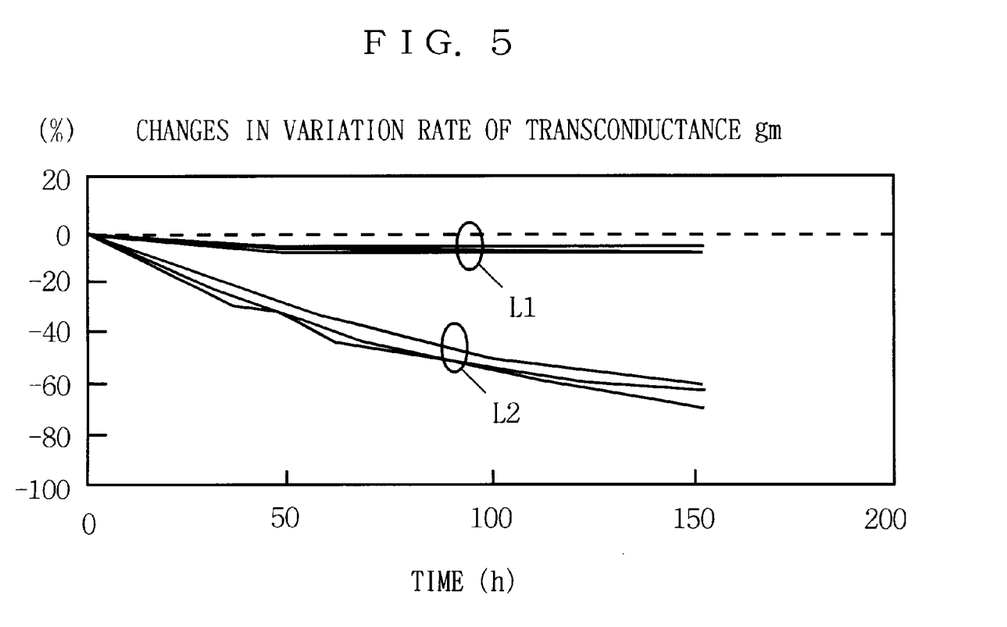
FIG. 5 is a diagram showing changes with time in variation rate of the transconductance of the FETs of the embodiment and the comparison example in the high-temperature humidifying test.
Figure 6:
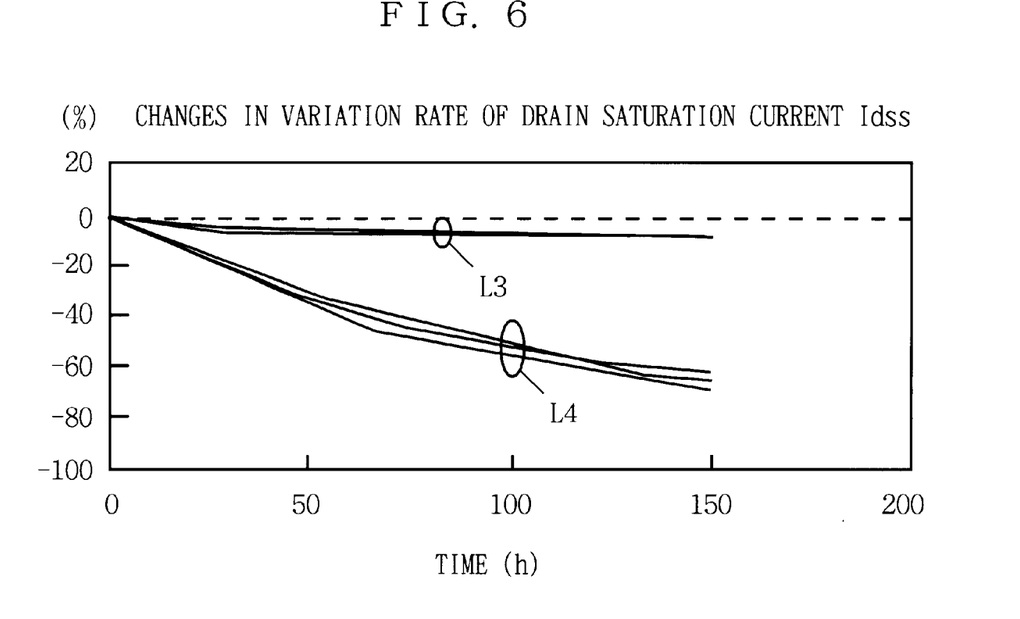
FIG. 6 is a diagram showing changes with time in variation rate of the drain saturation current of the FETs of the embodiment and the comparison example in the high-temperature humidifying test.

Table 1 shows initial values of the transconductance gm and the drain saturation current Idss of the FETs of the embodiment and the comparison example in the high-temperature humidifying test. FIG. 5 shows changes with time in variation rate of the transconductance gm of the FETs of the embodiment and the comparison example in the high-temperature humidifying test and FIG. 6 shows changes with time in variation rate of the drain saturation current Idss of the FETs of the embodiment and the comparison example in the high-temperature humidifying test.

The values of the transconductance gm and the drain saturation current Idss are those at a gate voltage of 0 V. The high-temperature humidifying test was conducted at a temperature of 121° C. and a humidity of 100% (2 atm).

TABLE 1

|  | Initial value | |
| --- | --- | --- |
|  | gm (mS) | Idss (mA) |
| FET for comparison | 92 | 133 |
| FET of embodiment | 86 | 122 |

In FIG. 5, L1 and L2 show the changes in variation rate of the transconductance gm of the embodiment and the comparison example, respectively. In FIG. 6, L3 and L4 show the changes in variation rate of the drain saturation current Idss of the embodiment and the comparison example, respectively.

As shown in Table 1, FIG. 5 and FIG. 6, there is no significant difference in the initial values of the transconductance gm and drain saturation current Idss between the FETs of the embodiment and the comparison example. However, with the time-dependent changes in the high-temperature humidifying test, while the variation rates of the transconductance gm and drain saturation current Idss of the FET of the embodiment are about −10% even after 150 hours have passed, the variation rates of the transconductance gm and drain saturation current Idss of the FET of the comparison example having the protrusion over the mesa step portion reach as high as −70%. These results show that the structure of the FET of this embodiment has good resistance to moisture.

The present invention can be applied not only to the above-described embodiment but also to various semiconductor devices formed by mesa etching. For example, the present invention can be applied to HEMTs (High-Electron Mobility Transistors) and TMTs (Two-Mode Channel FETs) reported in IEEE ELECTRON DEVICE LETTERS, VOL.14, NO.7, July 1993, pp.354–356.

While the invention has been described in detail, the foregoing description is in all aspects illustrative and not restrictive. It is understood that numerous other modifications and variations can be devised without departing from the scope of the invention.

We claim:

1. A semiconductor device, comprising:

a semiconductor substrate comprising a lower substrate layer, a layer provided on said lower substrate layer, and a mesa-shaped region including a gate region; and an insulating protection film formed on said mesa-shaped region except in said gate region, wherein said insulating protection film in at least the gate width direction does not extend beyond an edge of said mesa-shaped region.

2. The semiconductor device according to claim 1, further comprising an insulating film formed in a region on said insulating protection film except in the gate region, wherein said insulating film in at least the gate width direction does not extend beyond the edge of said mesa-shaped region.

3. The semiconductor device according to claim 2, wherein said insulating film has a reverse pattern of a dummy gate formed on said insulating protection film in manufacturing.

4. The semiconductor device according to claim 2, further comprising a high-concentration doped region provided in the semiconductor substrate under said insulating film, wherein a length of said high-concentration doped region in said gate width direction is shorter than a width of the gate region of said mesa-shaped region.

5. The semiconductor device according to claim 2, wherein a distance between the edge of said mesa-shaped region and the edge of said insulating film in said gate width direction is equal to or shorter than 5% of a unit gate width.

6. The semiconductor device according to claim 2, wherein a distance between the edge of said mesa-shaped region and the edge of said insulating film in said gate width direction is 5 μm or shorter.

7. The semiconductor device according to claim 1, wherein said semiconductor substrate is formed of gallium arsenide, and said insulating protection film is formed of silicon nitride.

8. The semiconductor device according to claim 2, wherein said semiconductor substrate is formed of gallium arsenide, said insulating protection film is formed of silicon nitride, and said insulating film is formed of silicon oxide.

9. The semiconductor device according to claim 4, further comprising a gate electrode formed on said gate region of said mesa-shaped region.

10. The semiconductor device according to claim 4, wherein said layer provided on said lower substrate layer and said high-concentration doped region have one conductivity type.

11. The semiconductor device according to claim 2, further comprising a second protection film formed to cover the mesa-shaped region on said semiconductor substrate, said insulating protection film and said insulating film.

12. The semiconductor device according to claim 11, wherein said second protection film is a protection film for moisture resistance.

13. A field-effect transistor comprising:

a semiconductor substrate comprising a lower substrate layer, a layer provided on said lower substrate layer, and a mesa-shaped region having a gate region, a source region and a drain region; and an insulating protection film formed on said mesa-shaped region except in said gate region, said source region and said drain region, wherein said insulating protection film in at least the gate width direction does not extend beyond an edge of said mesa-shaped region.

14. The field-effect transistor according to claim 13, further comprising an insulating film formed in a region on said insulating protection film except in the gate region, wherein said insulating film in at least the gate width direction does not extend beyond the edge of said mesa-shaped region.

15. The field-effect transistor according to claim 14, wherein said insulating film has a reverse pattern of a dummy gate formed on said insulating protection film in manufacturing.

16. The field-effect transistor according to claim 14, further comprising a high-concentration doped region provided in the semiconductor substrate under said insulating film, wherein a length of said high-concentration doped region in said gate width direction is shorter than a width of the gate region of said mesa-shaped region.

17. The field-effect transistor according to claim 14, wherein a distance between the edge of said mesa-shaped region and the edge of said insulating film in said gate width direction is equal to or shorter than 5% of a unit gate width.

18. The field-effect transistor according to claim 14, wherein a distance between the edge of said mesa-shaped region and the edge of said insulating film in said gate width direction is 5 μm or shorter.

19. The field-effect transistor according to claim 13, wherein said semiconductor substrate is formed of gallium arsenide, and said insulating protection film is formed of silicon nitride.

20. The field-effect transistor according to claim 14, wherein said semiconductor substrate is formed of gallium arsenide, said insulating protection film is formed of silicon nitride, and said insulating film is formed of silicon oxide.

21. The field-effect transistor according to claim 13, further comprising:

a gate electrode formed on said gate region of said mesa-shaped region, a source electrode formed on said source region of said mesa-shaped region, and a drain electrode formed on said drain region of said mesa-shaped region.

22. The field-effect transistor according to claim 16, wherein said layer provided on said lower substrate layer and said high-concentration doped region have one conductivity type.

23. The field-effect transistor according to claim 13, further comprising a second protection film formed to cover the mesa-shaped region on said semiconductor substrate, said insulating protection film and said insulating film.

24. The field-effect transistor according to claim 23, wherein said second protection film is a protection film for moisture resistance.

* * * * *